(12) United States Patent
Priborsky et al.

(10) Patent No.: US 6,380,873 B1
(45) Date of Patent: Apr. 30, 2002

(54) METHOD FOR REDUCING RADIO FREQUENCY EMISSIONS ON HIGH-SPEED SERIAL BUSES

(75) Inventors: Anthony L. Priborsky, Lyons, CO (US); Knut S. Grimsrud, Forest Grove, OR (US); John Brooks, San Jose, CA (US)

(73) Assignee: Quantum Corporation, Milpitas, CA (US)

( * ) Notice: Subject to any disclaimer, the term of this patent is extended or adjusted under 35 U.S.C. 154(b) by 0 days.

(21) Appl. No.: 09/608,148

(22) Filed: Jun. 30, 2000

(51) Int. Cl.$^7$ ................................................ H03M 7/30
(52) U.S. Cl. ............................ 341/87; 341/50; 341/55; 341/60; 341/63; 341/67; 710/57; 710/68; 710/69; 711/118; 711/129; 711/170; 711/173; 235/431
(58) Field of Search ............................. 341/50, 55, 58, 341/87, 59, 63, 60, 67; 235/431; 710/68, 69, 57; 711/173, 118, 170, 129

(56) References Cited

U.S. PATENT DOCUMENTS

| | | | | |
|---|---|---|---|---|
| 4,232,375 A | * | 11/1980 | Paugstat et al. | 710/68 |
| 4,280,192 A | * | 7/1981 | Moll | 710/68 |
| 4,412,306 A | * | 10/1983 | Moll | 710/68 |
| 4,642,793 A | * | 2/1987 | Meaden | 710/68 |
| 5,434,568 A | * | 7/1995 | Moll | 341/87 |
| 5,600,316 A | * | 2/1997 | Moll | 341/87 |
| 5,684,478 A | * | 11/1997 | Panaoussis | 341/51 |
| 5,949,355 A | * | 9/1999 | Panaoussis | 341/51 |
| 6,127,953 A | * | 10/2000 | Manzardo | 341/87 |

* cited by examiner

Primary Examiner—Michael Tokar
Assistant Examiner—Lam T. Mai

(57) ABSTRACT

A method for reducing radio frequency interference from a high frequency serial bus by scrambling data signals and reducing the repetition of control signals. Beginning and ending control signals are provided with meaningless signals provided therebetween.

29 Claims, 2 Drawing Sheets

```
SYNC       SYNC
SOF        SOF
data1      data1
data2      data2
data3      data3
HOLD       HOLD
HOLD       junk1
HOLD       junk2
HOLD       junk3
HOLD       junk4
HOLD       UNHOLD
data4      data4
data5      data5
CRC        CRC
EOF        EOF
SYNC       SYNC
```

| Fig. 1 | Fig. 2 | Fig. 3 | Fig. 4 |
|---|---|---|---|
| SYNC | SYNC | SYNC | SYNC |
| SOF | SOF | SOF | junk1 |
| data1 | data1 | data1 | junk2 |
| data2 | data2 | data2 | junk3 |
| data3 | data3 | data3 | junk4 |
| HOLD | HOLD | HOLD | SOF |
| HOLD | junk1 | CONT | data1 |
| HOLD | junk2 | junk1 | data2 |
| HOLD | junk3 | junk2 | |
| HOLD | junk4 | junk3 | |
| HOLD | UNHOLD | junk4 | |
| data4 | data4 | HOLD | |
| data5 | data5 | data4 | |
| CRC | CRC | data5 | |
| EOF | EOF | CRC | |
| SYNC | SYNC | EOF | |
| | | SYNC | |

METHOD FOR REDUCING RADIO FREQUENCY EMISSIONS ON HIGH-SPEED SERIAL BUSES

FIELD

The present invention is directed to reducing radio frequency emissions and, more particularly, the present invention is directed to arrangements for reducing emissions on high-speed serial buses.

BACKGROUND

Any time high frequency signals travel through a wire or a bus, electromagnetic radiation or emissions are produced. In order to prevent interference in the communication bands, regulation agencies, such as the Federal Communications Commission in the United States require that the radio frequency interference (RFI) be limited. It is possible, of course, to prevent such RFI by shielding the equipment, although this involves some cost. In digital systems, such as in a serial bus, as the data rate increases, repetitive signals can produce emissions that can fall into the radio frequency range. However, as long as the data signals occur in a random pattern, the emissions are spread more widely across the spectrum and thus do not create problems. However, if a signal is repeated for a long period of time, the emissions fall into a limited number of frequencies so that an RFI problem is created at those frequencies.

One currently used encoding scheme is the 8B/10B encoding scheme described in U.S. Pat. No. 4,486,739 which utilizes special control characters which contain unique bit sequences and are different from the normal data characters which are commonly used. Control characters are used to obtain and maintain a data clock, and one bit sequence contained in some control characters, the "comma", is used to obtain and maintain word synchronization. These sequences—generally referred to as primitives—typically begin with a control character followed by three data characters, with the four character sequence being unique and defining each primitive. The control character at the start of the primitive may, but is not required to, contain a comma depending on the implementation. User data is typically transmitted between two such primitives—which delineate the beginning and end of a block of user data.

However, if these control characters become repetitive, an RFI problem can be created. For example, if a system which is receiving a signal has a buffer which is full, it will send back a HOLD signal to indicate that no more data should be sent at this time. This HOLD signal may be repeated continuously until the buffer has room for receiving more data. This repetitive HOLD signal will produce an RFI problem.

One method to avoid problems from repetitive control characters is to utilize a small number of control signals interchangeably so that they are not repeated very often. Thus, the same control signal may take any one of 8 or so forms which are rotated in use. Thus, the repetitive nature of the signal is then reduced. Furthermore, it requires that the system utilize a larger number of control characters which requires larger storage and impacts the complexity of generating and decoding them. Also, since the characters are fairly similar, the EMI reduction is not very good.

Another process is to scramble the signals which are being transmitted. That is, repetitive signals are scrambled to a different form each time so that different frequencies are generated from the bus to avoid emissions at specific frequencies. Specific methods of scrambling are well known. However, problems arise in systems such as 8B/10B, since specific control characters must be utilized in order to maintain synchronization and to be recognized at the receiving end. While scrambling will work for data streams, if the control characters are scrambled, they will not be recognized and the signal will not be handled properly at the other end

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and the invention is not limited thereto. The spirit and scope of the present invention are limited only by the terms of the appended claims.

The following represents brief descriptions of the drawings, wherein:

FIG. 1 is an example character stream of an example system having a disadvantageous arrangement;

FIG. 2 is a first example character stream of an example system having an advantageous arrangement of the present invention;

FIG. 3 is a second example character stream of an example system having an advantageous arrangement of the present invention;

FIG. 4 is a third example character stream of an example system having an advantageous arrangement of the present invention;

DETAILED DESCRIPTION

Figure 5:
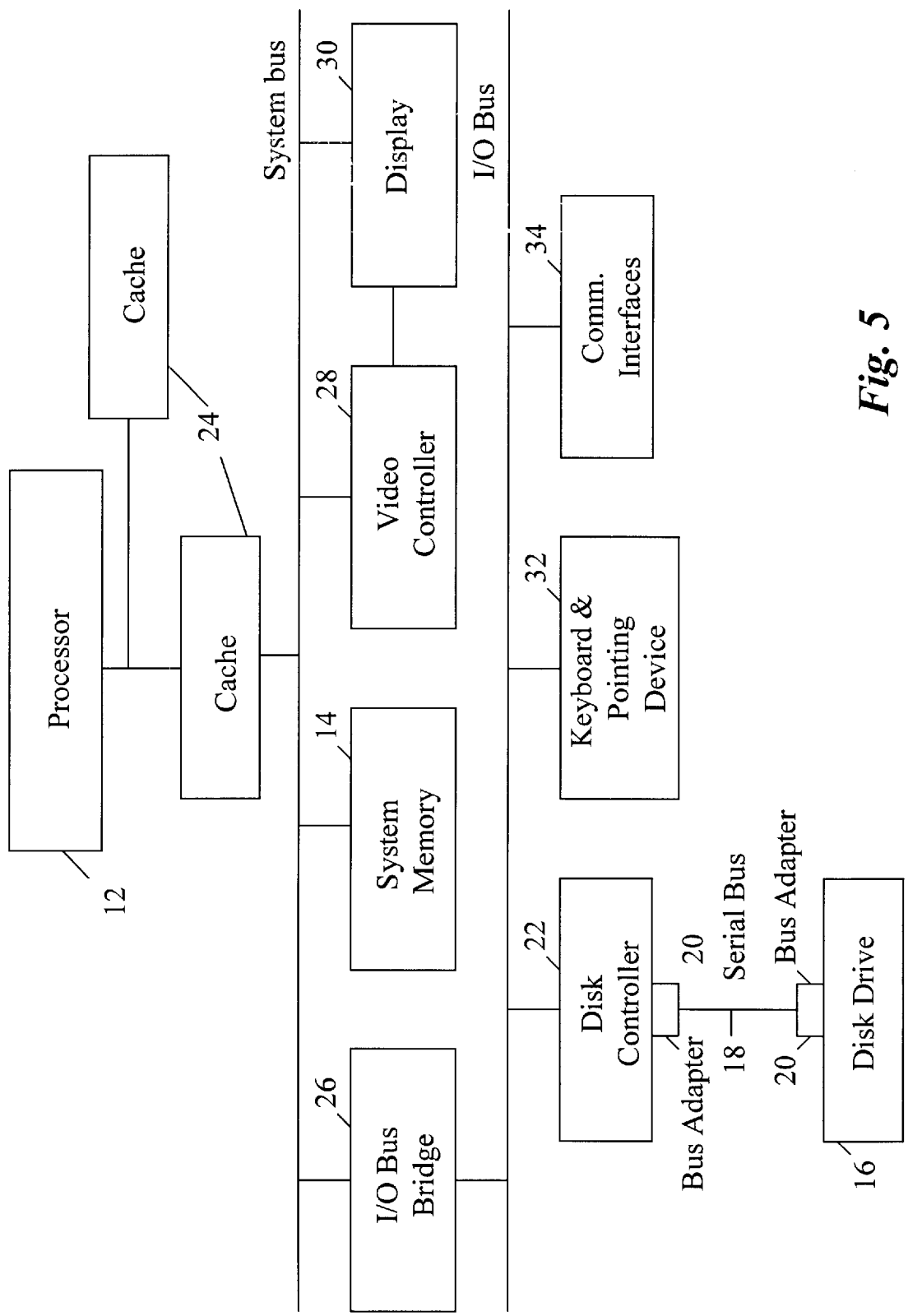
FIG. 5 is an example embodiment of an example system having an advantageous arrangement of the present invention.

Before beginning a detailed description of the subject invention, mention of the following is in order. When appropriate, like reference numerals and characters may be used to designate identical, corresponding or similar components in differing figure drawings. Further, in the detailed description to follow, example sizes/models/values/ranges may be given, although the present invention is not limited to the same. As a final note, well known power/ground connections to ICs and other components may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements is highly dependent upon the platform within which the present invention is to be implemented, i.e., specifics should be well within purview of one skilled in the art. Where specific details (e.g., circuits, flowcharts) are set forth in order to describe example embodiments of the invention, it should be apparent to one skilled in the art that the invention can be practiced without these specific details. Finally, it should be apparent that any combination of hard-wired circuitry and software instructions can be used to implement embodiments of the present invention, i.e., the present invention is not limited to any specific combination of hardware circuitry and software instructions.

FIG. 1 shows an example character stream as would be found in an 8B/10B encoding scheme where the receiving equipment has a buffer which is full and thus sends a HOLD signal back to the originating equipment. As seen in FIG. 1, the first signal is a synchronizing signal, followed by a start of frame (SOF) signal. Various data signals are then included until the buffer becomes full, at which time a series of HOLD signals are sent. Although six of these signals are indicated, in fact a much larger number could occur. When the buffer finally has space, additional data signals are produced followed by a CRC character used as a redundancy check to see if the data has been corrupted. This is followed by an end of frame (EOF) signal and another synchronization signal.

As indicated above, problems occur due to the repetitive nature of the HOLD signal. By repeating this signal a number of times, the RFI increases dramatically because the energy is concentrated in certain parts of the spectrum.

One method of avoiding this problem is to modify the HOLD signals so that the HOLD signal is only produced a few times at the beginning of the sequence as seen in FIG. 2. The end of the sequence is then indicated by another control signal such as UNHOLD. The remaining signals in between are generated by a pseudo-random number generator indicated as junk1, junk2, etc. These signals can even have no meaning and are merely used to avoid a repetitive HOLD signal. They also retain the synchronization of the devices by having an appropriate number of bits in the signal. While the HOLD signal is indicated in the figure as a single symbol, in fact, one or more of HOLD signals are normally present to ascertain their identification.

A second slightly different method of accomplishing the same effect is to replace the small number of HOLD signals with one or more HOLD signal followed by a different control signal such as CONTINUE as shown in FIG. 3. This combination of control signals indicates that meaningless data will follow and could be ignored. The end of the meaningless data is indicated by any control character. Thus, the system understands that once a CONTINUE signal occurs, it should ignore everything until another control character is produced.

While the above two methods have been described in terms of a specific situation of a repetitive HOLD signal, it is equally applicable to any repetitive sequence of signals. Thus, any sequence of repetitive control signals can be replaced by a few instances of the control signal followed by meaningless junk signals and ended by a new control signal. Alternatively, a single beginning control signal can be followed by a new CONTINUE control signal. The specific control signal which is being avoided can be any control signal.

Thus, these systems can also be used in a situation where the bus is completely idol so that a series of SYNC signals (also known as IDLE signals) are sent through the bus in order to show that it is still operational. The series of SYNC signals can be replaced by one or more SYNC signals followed by data signals which may have no meaning an ending with a control signal such as a start-of-frame (SOF) signal. An example of this is shown in FIG. 4. Of course, the CONTINUE control signal may also be used to follow an initial SYNC signal to obtain the same result.

This system allows for the forwarding of the frame by bridges and switches that may add or remove a certain number of primitives from a stream of repeated primitives so long as a certain minimum are preserved. In particular, it allows for the insertion or removal of data words by the switch or bridge as long as the special start-of-frame/end-of-frame markers are preserved. This could be particularly important when a switch provides a speed matching function between two or more links operating a different speeds.

While specifying a unique pair of control signals is important, the number of scrambled words between them is not. The maximum number of scrambled words transmitted would be implementation dependent. It would potentially be the maximum size of a data payload since the length of such a frame is often determined by the need for a control character containing a comma to verify word synchronization has been maintained during the transmission of a payload.

In particular, this method is applicable to systems which use serial-ATA interconnects. A reduction in cable cost occurs with the use of the method since an unshielded cable can often be used.

This method could also be used for data signals although, as indicated above, data signals can normally be independently scrambled without the need to use such a system. It is only the control signals that normally need such a system since the synchronization and control of the data is necessary. Thus, it is possible to scramble the data signals while using the subject method for control signals in the same stream. The system has also been described in terms of an 8B/10B encoding scheme. However, it could equally well be applied to other encoding schemes which utilize control signals.

The scrambling of the data can be accomplished using a linear feedback shift register which is defined by a polynomial. The same polynomial must be used at both ends in order to descramble the data. The definition of the polynomial will determine the length of the cycle before a repeated unscrambled stream results in a repeat in the scrambled stream. This point may be many kilobytes for even a simple polynomial.

The scheme indicated above can be implemented in a simple fashion by encoding the characters in the processor, bus adaptor or other equipment which produces the character stream. Thus, there is a reduced need for shielding or other physical controls to remove the RFI. In addition, studies have shown this method to be extremely effective and, in fact the RFI can be reduced by as much as 20 decibels. Accordingly, this is an effective and inexpensive method of reducing RFI.

The above methods have been described in terms of the characters present and the character stream. In FIG. 5, the structural organization is shown as including a serial bus typically used within a computer, such as a personal computer. The serial bus 18 is shown as connecting a disk controller 22 with a disk drive 16. A bus adapter 20 is used for receiving data and preparing it for transmission across the serial bus. A similar device is arranged at the other end of the serial bus to receive the data as sent through the bus. The computer includes other circuits such as a processor 12, caches 24, I/O bus bridge 26, system memory 14, video controller 28 and display 30. The I/O bus bridge 26 connects a system bus with an I/O bus. The system bus links the processor memory and video controller together. The I/O bus is connected to the disk controller, a key board and pointing device 32 and interfaces 34.

Although this has been described in terms of a bus within a single device, it is also possible to utilize the bus between two computers or two other pieces of electronic data. In such a situation, a similar arrangement of parts is included in order to adjust the character stream and submit it along the bus. Thus, this method has application anywhere that a serial bus is utilized, whether within a single piece of equipment or between two or more pieces of equipment.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A method for reducing radio frequency emissions in a bus, comprising:

preparing a character stream for transmission along said bus;

replacing repetitive control characters in said character stream with a series of characters which are non-repetitive to reduce radio frequency emissions.

2. A method for reducing radio frequency emissions in a bus, comprising:

preparing a character stream for transmission along said bus;

replacing repetitive control characters in said character stream with a series of characters which are non-repetitive to reduce radio frequency emissions wherein said series of non-repetitive characters includes at least one control character at a beginning of said series and at least one control character at an ending of said series with a series of scrambled meaningless signals between said beginning control signal and said ending control signal in said series.

3. The method according to claim 2, wherein the at least one beginning control character is a small number of the same control characters.

4. The method according to claim 3, wherein the same control character is a predetermined HOLD character.

5. The method according to claim 4, wherein the at least one ending control character is a predetermined UNHOLD character.

6. The method according to claim 3, wherein the same control character is a predetermined SYNC character.

7. The method according to claim 2, wherein the at least one beginning control character is one control character followed by a different control character.

8. The method according to claim 7, wherein the one control character is a predetermined HOLD character and the different control character is a predetermined CONTINUE character.

9. The method according to claim 7, wherein the one control character is a predetermined SYNC character and the different control character is a predetermined CONTINUE character.

10. The method according to claim 2, wherein the data signals are scrambled data signals which are non-repetitive.

11. A method for reducing radio frequency emissions in a bus, comprising:

preparing a character stream for transmission along said bus;

replacing repetitive control characters in said character stream with a series of characters which are non-repetitive to reduce radio frequency emissions;

wherein said character stream is encoded according to an 8B/10B scheme.

12. A method for reducing radio frequency emissions in a bus, comprising:

preparing a character stream for transmission along said bus;

replacing repetitive control characters in said character stream with a series of characters which are non-repetitive to reduce radio frequency emissions;

wherein the bus is a serial ATA interconnect.

13. A system for reducing radio frequency interference, comprising:

a bus for carrying signals;

a first and second signal generator/receiver connected to opposite ends of said bus;

said first and second generator/receiver providing character streams for transmission along said bus and replacing repetitive control characters with nonrepetitive signals, to reduce radio frequency interference.

14. A system according to claim 13, wherein said first and second signal generator/receivers are bus adaptors.

15. A system according to claim 13, wherein said first and second signal generator/receivers are a processor and a hard drive within the same system.

16. A system according to claim 13, wherein said first and second signal generator/receivers are in two separate systems connected by said bus.

17. A system for reducing radio frequency interference, comprising:

a bus for carrying signals;

a first and second signal generator/receiver connected to opposite ends of said bus;

said first and second generator/receiver providing character streams for transmission along said bus and replacing repetitive control characters with nonrepetitive signals wherein said character stream includes scrambled meaningless data signals between at least one beginning control character and at least one ending control character.

18. A system for reducing radio frequency interference, comprising:

a bus for carrying signals;

a first and second signal generator/receiver connected to opposite ends of said bus;

said first and second generator/receiver providing character streams for transmission along said bus and replacing repetitive control characters with nonrepetitive signals;

wherein said character stream is encoded according to an 8B/10B scheme.

19. A system according to claim 13, wherein said bus is a serial ATA interconnect.

20. A method of encoding a data stream comprising:

scrambling data characters in said data stream;

providing control characters as a series of characters which are non-repetitive to reduce radio frequency emissions.

21. A method of encoding a data stream comprising:

scrambling data characters in said data stream;

providing control characters as a series of characters which are non-repetitive to reduce radio frequency emissions;

wherein said series of non-repetitive characters includes at least one control character at a beginning of said series and at least one control character at an ending of said series with a series of scrambled signals between said beginning control signal and said ending control signal in said series.

22. The method according to claim 21, wherein the at least one beginning control character is a small number of the same control characters.

23. The method according to claim 22, wherein the same control character is a predetermined HOLD character.

24. The method according to claim 23, wherein the at least one ending control character is a predetermined UNHOLD character.

25. The method according to claim 22, wherein the same control character is a predetermined SYNC character.

26. The method according to claim 21, wherein the at least one beginning control character is one control character followed by a different control character.

27. The method according to claim 26, wherein the one control character is a predetermined HOLD character and the different control character is a predetermined CONTINUE character.

28. The method according to claim 26, wherein the one control character is a predetermined SYNC character and the different control character is a predetermined CONTINUE character.

29. The method according to claim 21, wherein the data signals are scrambled data signals which are non-repetitive.

* * * * *